(12) United States Patent
Hajimiri et al.

(10) Patent No.: US 6,690,570 B2
(45) Date of Patent: Feb. 10, 2004

(54) HIGHLY EFFICIENT CAPACITOR STRUCTURES WITH ENHANCED MATCHING PROPERTIES

(75) Inventors: Seyed-Ali Hajimiri, Pasadena, CA (US); Roberto Aparicio, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/927,761

(22) Filed: Aug. 9, 2001

(65) Prior Publication Data

US 2002/0093780 A1 Jul. 18, 2002

Related U.S. Application Data

(60) Provisional application No. 60/232,651, filed on Sep. 14, 2000.

(51) Int. Cl.$^7$ ............................................... H01G 6/228
(52) U.S. Cl. ............................... 361/306.1; 361/306.3; 361/329; 361/309
(58) Field of Search ............................... 361/306.1, 309, 361/306.3, 313, 301.4, 301.1, 277, 329

(56) References Cited

U.S. PATENT DOCUMENTS 5,583,359 A  * 12/1996 Ng et al. ..................... 257/306

FOREIGN PATENT DOCUMENTS

| EP | 0 905 792 A2 | 3/1999 | .......... H01L/29/92 |
| JP | 10065101 | 3/1998 | .......... H01L/27/04 |
| WO | WO 01/78149 A3 | 10/2001 | .......... H01L/27/08 |
| WO | WO 01/99163 A2 | 12/2001 | .......... H01L/21/02 |

OTHER PUBLICATIONS

Sowlati et al. "Interdigitated Multilayer Capacitor Structure for Deep Sub-Micron CMOS" Published Apr. 25, 2002.*
Search Report for PCT/US01/28693 Dated Aug. 9, 2002 in related PCT filing of pending U.S. application.
Aparicio, Roberto, et al., *Capacity Limits and Matching Properties of Lateral Flux Integrated Capacitors*, paper presented at *IEEE Custom Integrated Circuits Conference, San Diego, CA.*, (May 6–9, 2001).

* cited by examiner

Primary Examiner—Anthony Dinkins
(74) Attorney, Agent, or Firm—Christopher J. Rourk; Akin Gump Strauss Hauer & Feld, LLP

(57) ABSTRACT

The present specification discloses highly efficient capacitor structures. One embodiment of the present invention is referred to herein as a vertical parallel plate (VPP) structure. In accordance with this embodiment, a capacitor structure having a plurality of vertical plates. The vertical plates are substantially parallel to each other, and each vertical plate has multiple conducting strips. These conducting strips are substantially parallel to each other and are connected to each other by one or more vias. The vertical plates are alternately connected to each other, creating a first portion of the vertical plates and a second portion of the vertical plates, such that the first portion of the vertical plates forms a first terminal of the capacitor structure, and the second portion of the vertical plates forms a second terminal of the capacitor structure. Either slotted vias or individual vias can be used to connect the conducting strips.

12 Claims, 16 Drawing Sheets

HIGHLY EFFICIENT CAPACITOR STRUCTURES WITH ENHANCED MATCHING PROPERTIES

CROSS-REFERENCE TO RELATED APPLICATIONS

This invention claims the benefit of Provisional Application No. 60/232,651, filed on Sep. 14, 2000. The contents of that application are incorporated by reference herein.

BACKGROUND OF THE INVENTION

1. Field of the Invention

The present invention generally relates to using lateral field capacitor structures to increase the capacitance density per unit area in integrated circuit capacitors, and in particular to using novel lateral-field optimal high efficient capacitor structures that maximize the flux usage in the interlayer metal separation region, as well as, in the metal layer region.

2. Description of Related Art

Capacitors are essential elements in integrated circuits, such as sample and holds, analog-to-digital (A/D) and digital-to-analog (D/A) converters, switched-capacitor and continuous-time filters, as well as, radio frequency (RF) blocks. In many of these applications, capacitors consume a large portion of a chip's area. Thus, the capacitor's area efficiency is of primary importance. In analog applications, the other desired properties for capacitors are close matching of adjacent capacitors, linearity, small bottom-plate capacitor, and to a lesser degree, the absolute accuracy of the value (i.e., tolerance). In RF applications, it is essential for the capacitors to have self-resonance frequencies, well in excess of the frequency of interest and large quality factors (Q). Good linearity and large breakdown voltage are the other two desired properties for a good RF capacitor.

Several approaches have been taken to improve the area efficiency of capacitors. For example, nonlinear capacitors with high capacitance density, such as junction or gate oxide capacitors have been used for a long time in applications where the linearity and the quality factor, Q, of the capacitors are not important. Unfortunately, these capacitors need a dc bias and are strongly process and temperature dependent. In high precision circuits, such as data converters, their use is limited to bypass and coupling capacitors, or varactors in RF circuits.

On the other hand, metal-to-metal and metal-to-poly capacitors have very good linearity and quality factors, Q. However, they suffer from a low capacitance density. The low capacitance density manly arises from large metal-to-metal/metal-to-poly vertical spacing that determines the capacitance in the horizontal parallel plate (HPP) structure 100, shown in FIG. 1. Unfortunately, in today's process technologies, this large vertical spacing does not shrink as fast as the lateral separation to avoid excessive crosstalk between the digital metal lines in different layers. Thus, the parallel plate capacitors consume a larger fractional die area. Although an extra processing step involving depositing a thin layer of insulator between two metal or poly layers can mitigate the vertical spacing problem to some extent, this extra step is not available in many of the standard silicon-based technologies. Even if such special capacitor layers were available, the parallel plate structure does not necessarily result in the highest possible capacitance density The capacitance density can be improved by structures that exploit both lateral and vertical electric field components. A well known example of such structures is the interdigitated parallel wire structure 200 (also know as Horizontal Bars or HB), as shown in FIG. 2. Recently, several new structures were suggested as methods of obtaining higher capacitance per unit area. These structures include: a quasi-fractal structure 208; a woven structure 202 connected using vias 210 (the top view 204 of the woven structure 202 is also shown); and a second woven structure 206 without via 210 interconnections. The new structures 200, 202, 206, and 208 essentially demonstrate the same linearity as the HPP structure 100 (shown in FIG. 1), including both the metal-to-metal/poly capacitors. The only difference between the new structures 200, 202, 206, and 208 and the HPP structure 100 (shown in FIG. 1) is the higher capacitance densities. These structures 200, 202, 206, and 208 also provide lower bottom-plate capacitance, since more field lines end up on the adjacent metal line, as opposed to the substrate Despite these advantages, quasi-fractal structures 208 and woven structures 202 and 206 have not been widely used in the signal path of analog circuits because predicting their absolute capacitor value can be complicated and time consuming. Also, it is not clear that the quasi-fractal structures 208 and woven structures 202 and 206 are always advantageous over the more regular structures, such as the interdigitated parallel wire structures 200.

Thus, there is a need in the art for new capacitor structures with high efficiency, which demonstrate higher capacitance density and superior matching properties, as compared to the standard HPP structures 100 (shown in FIG. 1) and previously reported quasi fractal structures 208 (shown in FIG. 2) and woven structures 202 and 206 (shown in FIG. 2).

SUMMARY OF THE INVENTION

To overcome the limitations in the prior art described above, and to overcome other limitations that will become apparent upon reading and understanding the present specification, the specification discloses several capacitor structures that demonstrate high capacitance density, superior matching, tolerances, and self-resonance frequencies.

The first embodiment of the present invention is referred to herein as a vertical parallel plate (VPP) structure. In accordance with the first embodiment, a capacitor structure comprises a plurality of vertical plates. The vertical plates are substantially parallel to each other, and each vertical plate comprises multiple conducting strips. These conducting strips are substantially parallel to each other and are connected to each other by one or more vias. The vertical plates are alternately connected to each other, creating a first portion of the vertical plates and a second portion of the vertical plates, such that the first portion of the vertical plates forms a first terminal of the capacitor structure, and the second portion of the vertical plates forms a second terminal of the capacitor structure. Either slotted vias, interleaving vias or individual vias can be used to connect the conducting strips.

The second embodiment of the present invention is referred to herein as a vertical bars (VB) structure. In accordance with the second embodiment of the present invention, a capacitor structure comprises a plurality of rows of vertical bars, wherein within each row, the vertical bars are parallel to each other, and each vertical bar comprises multiple conducting patches. These conducting patches are connected to each other by one or more vias. The rows of vertical bars form a first direction and a second direction, wherein the second direction is orthogonal to the first direction. In the first direction, the vertical bars are alternately connected to each other, creating a first portion of the vertical plates and a second portion of the vertical plates. The first portion of the vertical plates forms a section of the first terminal of the capacitor structure, and the second portion of the vertical plates forms a section of the second terminal of the capacitor structure. In the second direction, the vertical bars are alternately connected to each other, creating a third portion of the vertical plates and a fourth portion of the vertical plates. The third portion of the vertical plates forms a remaining section of the first terminal of the capacitor structure, and the fourth portion of the vertical plates forms a remaining section of the second terminal of the capacitor structure.

Each patch has a lateral size. The lateral size affects the effective series resistance of the capacitor structure. The lateral size also affects the quality factor of the capacitor structure.

The fourth embodiment is similar to the first embodiment, and it is referred to herein as a two-layer VPP. The two-layer VPP structure comprises two VPP structures, wherein the first VPP is positioned in a first direction. The second VPP is located on top of the first VPP, and the second VPP is positioned in a second direction The second direction is orthogonal to the first direction.

The fifth embodiment is also similar to the first embodiment, and it is referred to herein as a multiple-layer VPP. The multiple-layer VPP structure comprises multiple (more than two) VPP structures, wherein a previous VPP is positioned in a first direction. A subsequent VPP is located on top of the previous VPP, and the subsequent VPP is positioned in a second direction. The second direction is orthogonal to the first direction.

Each of the above-described embodiments have utility for providing a capacitor structure with high efficiency, which results in higher capacitance density and superior matching and tolerance properties, as compared to prior art capacitor structures.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Several lateral-field, optimal-high efficient capacitor structures are described. Each of these capacitor structures maximizes the flux usage in the interlayer metal separation region, as well as, in the metal layer region.

Figure 3:
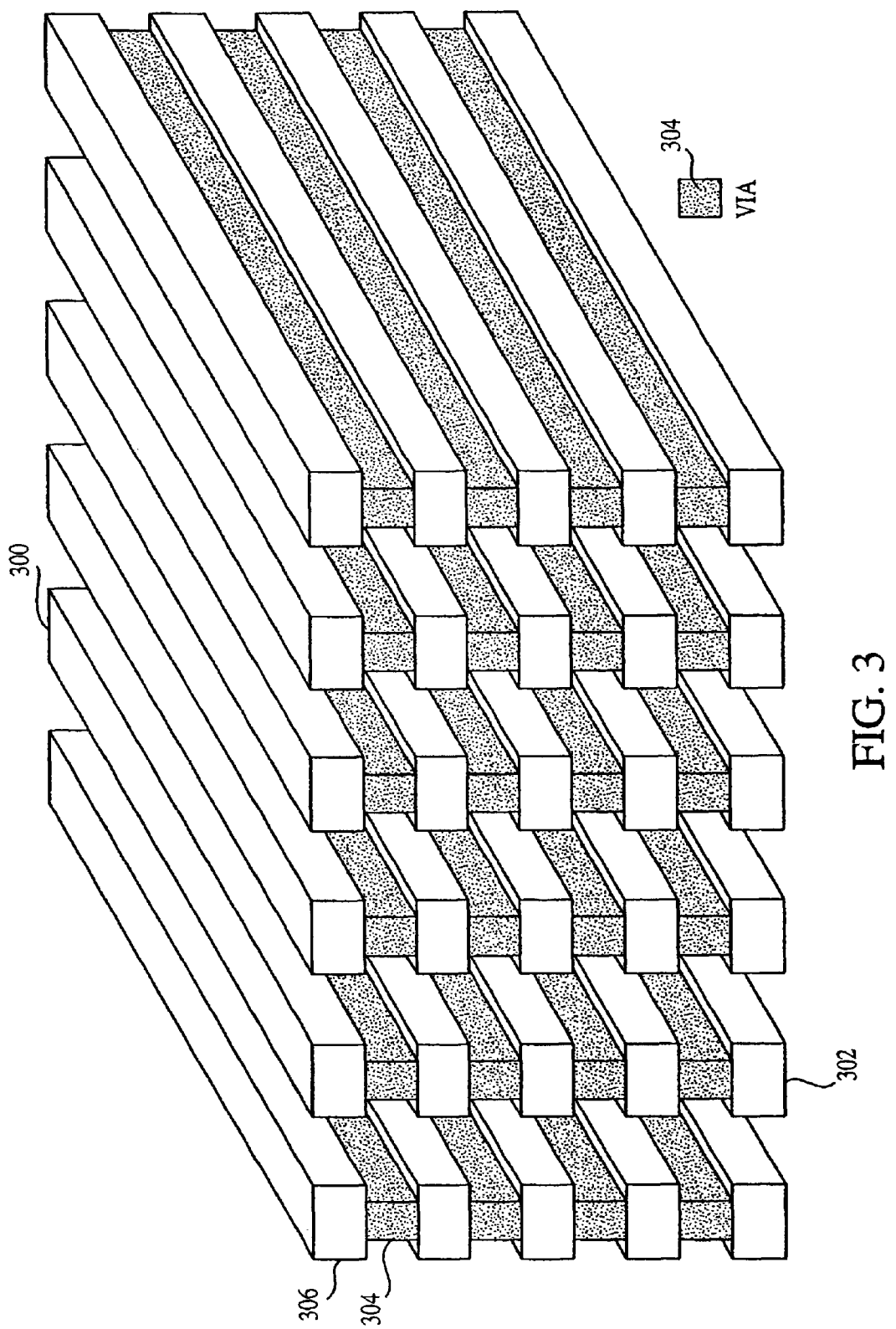
FIG. 3 represents an exemplary vertical parallel plate (VPP) structure, in accordance with the present invention.

FIG. 3 illustrates a capacitor structure that is referred to herein as a vertical parallel plate (VPP) structure 300. The VPP structure 300 has several vertical plates 302. Each of the vertical plates 302 are substantially parallel to each other, and located a predefined lateral distance from an adjacent vertical plate 302.

The vertical plates 302 comprise multiple conducting strips 306. The conducting strips 306 can be either metal conducting strips or poly crystalline silicon strips. The conducting strips 306 are substantially parallel to each other, and they are connected to each other by one or more vias 304. The vias 304 can either be slotted vias, interleaving vias or individual vias.

The vertical plates 302 are alternately connected, such that all the shaded vertical plates 302 are connected to each other, creating a first portion of the vertical plates 302; and all the clear vertical plates 302 are connected to each other, creating a second portion of the vertical plates 302. The first portion of the vertical plates 302 form a terminal of the capacitor structure, and the second portion of the vertical plates 302 form the other terminal of the capacitor structure.

To simplify the explanation of the figures and to show the terminals of the capacitors, some of the vertical plates 302 in FIG. 3 are shaded. Similar shading is used in FIG. 4 through FIG. 9. This shading does not, in any way, limit or restrict the scope of the present invention.

Figure 4:
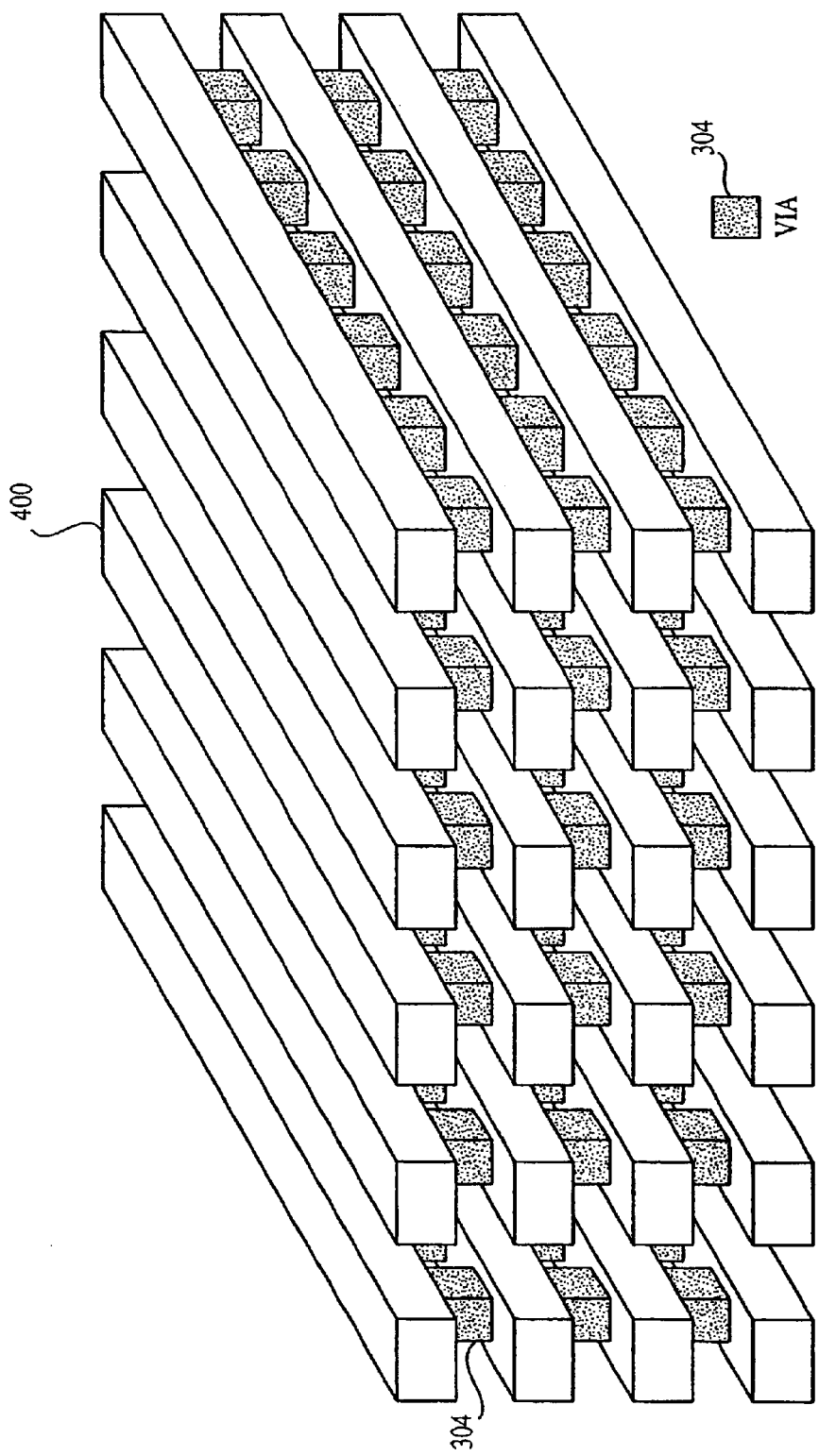
FIG. 4 represents an exemplary vertical parallel plate (VPP) structure implemented using stacked vias, in accordance with the present invention.
Figure 5:
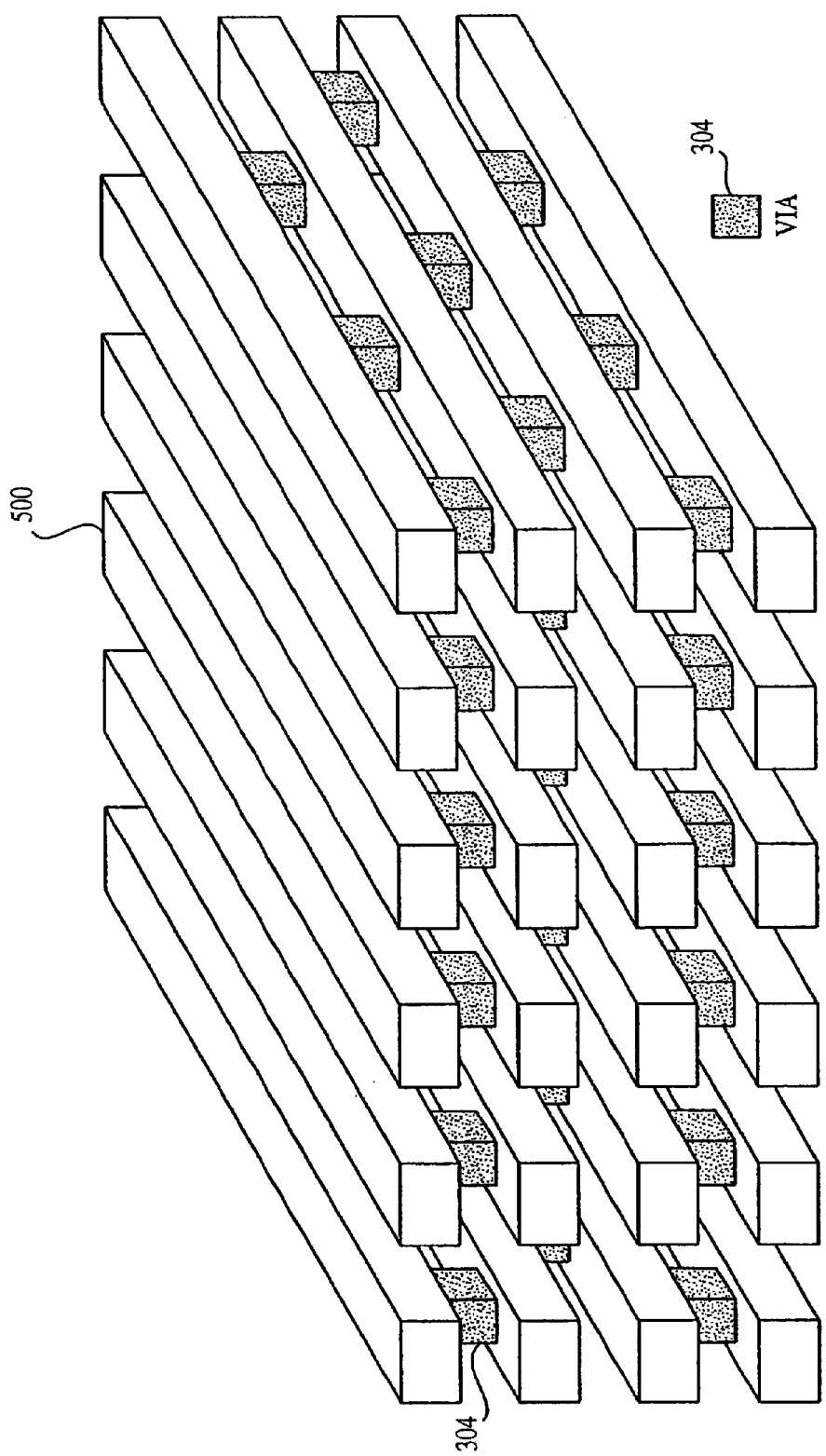
FIG. 5 represents an exemplary vertical parallel plate (VPP) structure implemented using interleaved vias, in accordance with the present invention.

The VPP structure 300 maximizes the lateral flux usage by using vertical plates 302 made out of conducting strips 306. The conducting strips 306 are connected by using vias 304 that maximize the lateral area of the vertical plates 302. The via 304 interconnections increase the effective lateral area of the vertical plates 302, and lowers the series electrical resistance by the introduction of alternative current paths, resulting in a higher quality factor, Q, for a given capacitor value. Moreover, due to the current flowing in opposite direction in the vertical plates 302, the inherent inductance is decreased. Also, as the VPP structure 300 attains higher capacitance density, smaller physical dimensions are achieved for a given capacitor value, thus, resulting in a shorter average signal path, and therefore, having a higher self-resonance frequency. Even though slotted vias 304 may not be supported in all process technologies, close approximation to these structures can be fabricated by using individual vias 304, as shown in FIG. 4 or using interleaving vias 304, as shown in FIG. 5. The top metal layer, which is usually thicker, and has different design rules, can be used to make the connection between the capacitor terminal and outside circuitry. Low series resistance is assured by the multiple placement of vias 304 and several signal path cross-connections.

Figure 6:
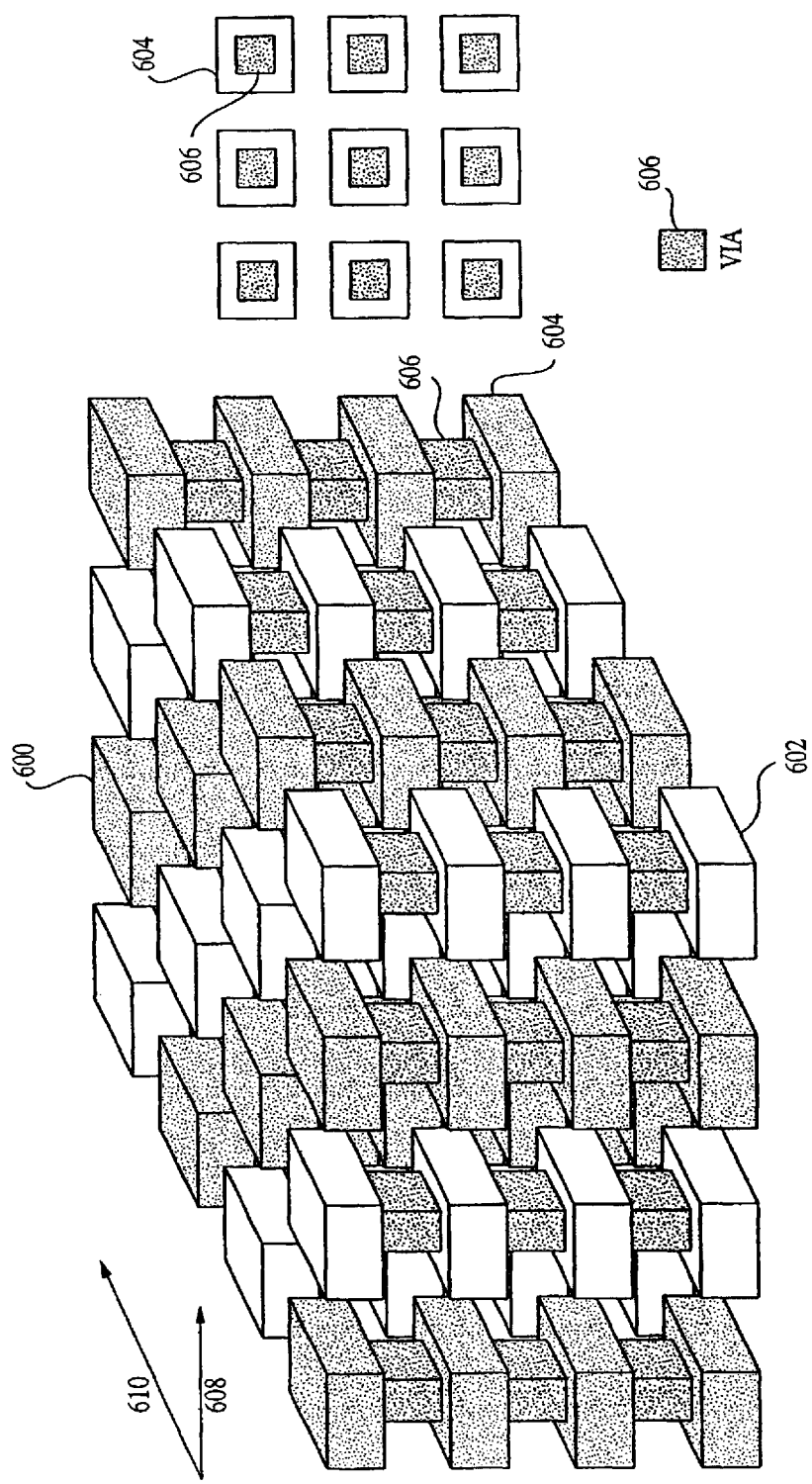
FIG. 6 represents an exemplary vertical bar (VB) structure, in accordance with the present invention.

FIG. 6 illustrates a structure, referred to herein as a vertical bar (VB) structure 600. The VB structure 600 has several rows of vertical bars 602. The vertical bars 602 are substantially parallel to each other, and the vertical bars 602 are located at a predefined lateral distance from each other.

Each vertical bar 602 has multiple conducting patches 604 (or squares). The conducting patches 604 can be metal conducting patches or poly-crystalline silicon conducting patches. Each of the conducting patches 604 have a lateral size. The lateral size affects the effective series resistance of the capacitor structure 600. The lateral size also affects the quality factor, Q, of the capacitor structure 600. The conducting patches 604 are connected to each other by one or more vias 606. The vias 606 can be either slotted via or individual vias.

The length of the vertical bars 602 is limited by the number and thickness of metal layers. The VB structure 600 can show a larger series resistance compared to the VPP 300 structure. However, the series resistance of the VB structure 600 is mainly determined by the via resistance. A large number of small capacitors in parallel form the total capacitance of the structure, and hence, the overall series resistance is the parallel combination of these resistors, which will be much smaller than an individual via 606.

The VB structure 600 has a higher capacitance density than the VPP structure 400 because the VB structure 600 utilizes the electric field in both the lateral and vertical dimensions. To illustrate, in FIG. 6, arrow 608 represents the lateral direction and arrow 610 represents the vertical direction. It is noted that the lateral direction is orthogonal to the vertical direction. In the lateral direction, the vertical bars 602 are alternately connected, such that all the shaded vertical bars 602 are connected to each other, creating a first portion of the vertical bars 602; and all the clear vertical bars 602 are connected to each other, creating a second portion of the vertical plates 602. The first portion of the vertical bars 602 form a section of the first terminal of a capacitor structure, and the second portion of the vertical bars 602 form the other terminal of the capacitor structure.

In the vertical direction, the vertical bars 602 are alternately connected, such that all the shaded vertical bars 602 are connected to each other, creating a third portion of the vertical bars 602; and all the clear vertical bars 602 are connected to each other, creating a fourth portion of the vertical plates 602. The third portion of the vertical bars 602 form the remaining section of the first terminal of the capacitor structure, and the fourth portion of the vertical bars 602 form the remaining section of the other terminal of the capacitor structure.

To simplify the explanation of the figures, and for illustration purposes only, some of the vertical bars 602 in FIG. 6 are shaded. This shading does not in any way limit or restrict the scope of the present invention.

Figure 7:
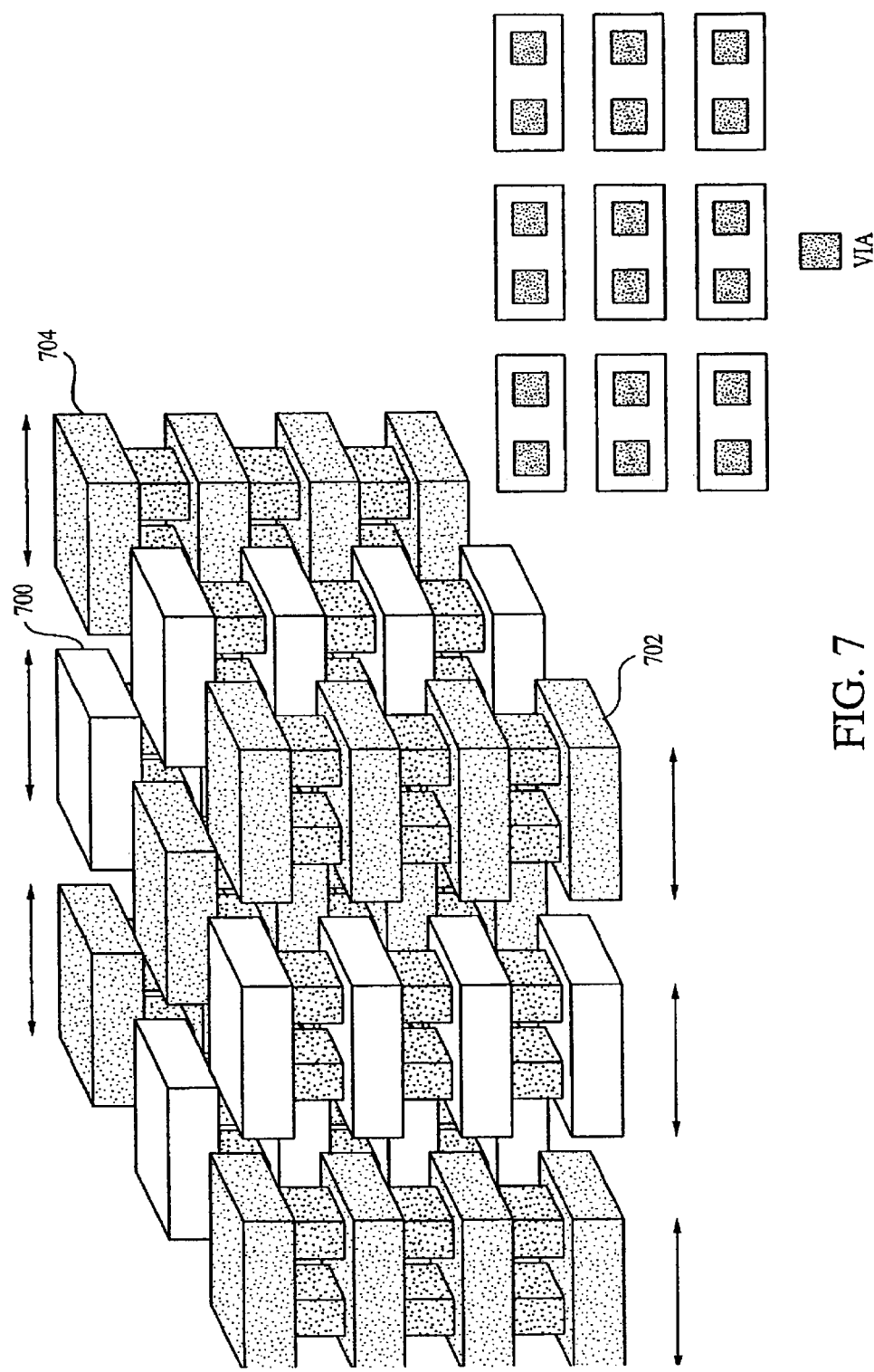
FIG. 7 represents an exemplary modified VB structure, in accordance with the present invention.

FIG. 7 illustrates another structure, referred to herein as a modified VB structure 700. The modified VB structure 700 extends the width of the vertical bars in one lateral dimension and is a compromise between the VPP structure 300 (shown in FIG. 3) and the VB structure 600 (shown in FIG. 6). Like the VB structure 600, the modified VB structure 700 utilizes the electric field in both the lateral and vertical directions, therefore the modified VB structure 700 has a higher capacitance density than the VPP structure 300. For the modified VB structure 700, the lateral size of each square 704 affects the effective series resistance of the modified VB structure 700. The lateral size of each square 704 also affects the quality factor, Q, of the modified VB structure 700.

Figure 8:
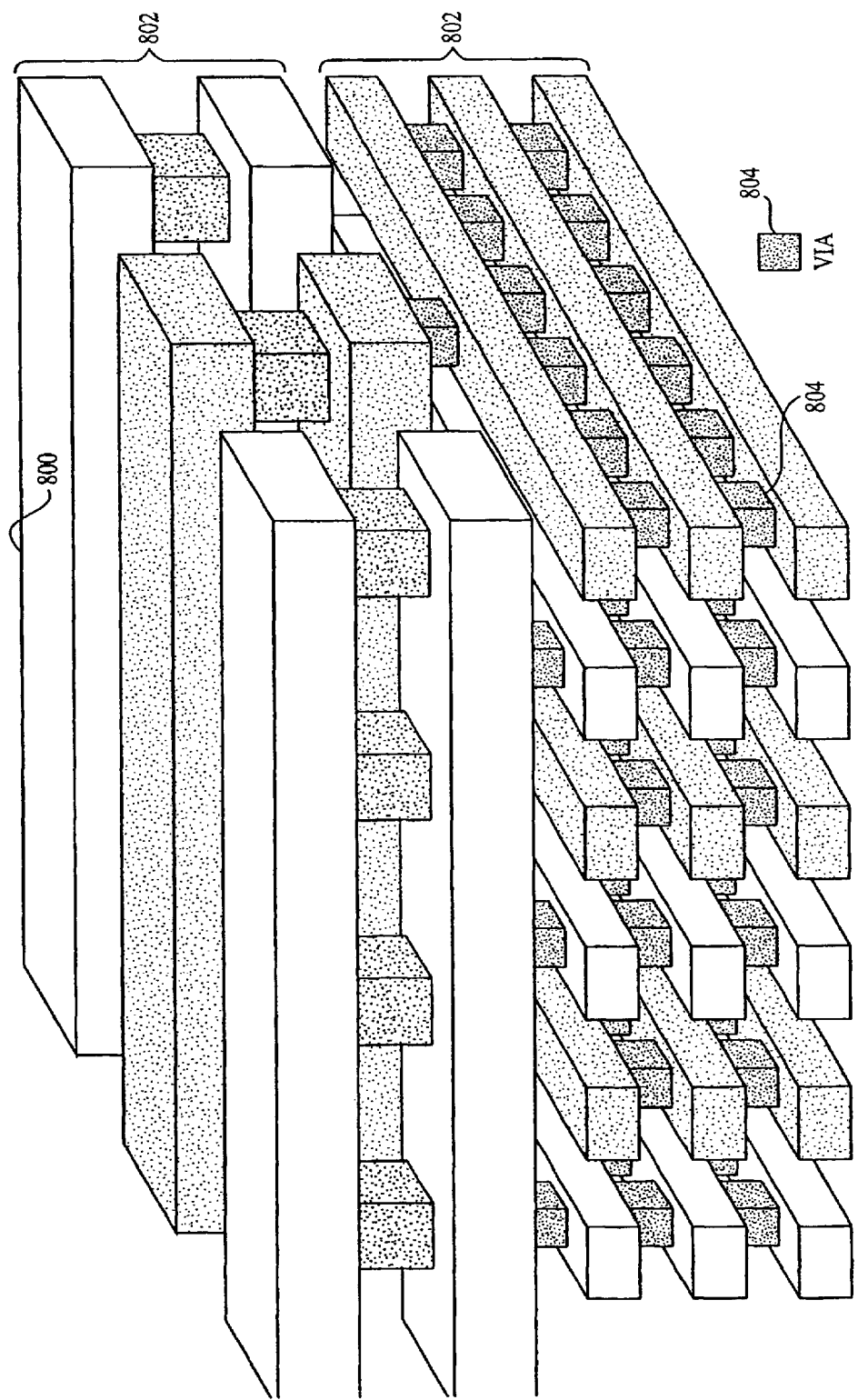
FIG. 8 represents an exemplary two-layer VPP structure, in accordance with the present invention.

FIG. 8 illustrates the fourth structure, referred to herein as a two-layer vertical parallel plate VPP structure 800. The two-layer VPP structure 800 comprises two VPP structures 802, wherein the first VPP structure 802 is positioned in a first direction. The second VPP structure 802 is located on top of the first VPP structure 802, and the second VPP sructure 802 is positioned in a second direction. The second direction is orthogonal to the first direction. It is noted that the two VPP structures 802 can have different types of vias 804. For example, the first VPP structure 802 could have individual vias 804, and the second VPP structure 802 could have interleaving vias 804. Of course, those skilled in the art will recognize that any combination of via types could be used without exceeding the scope of the present invention.

Figure 9:
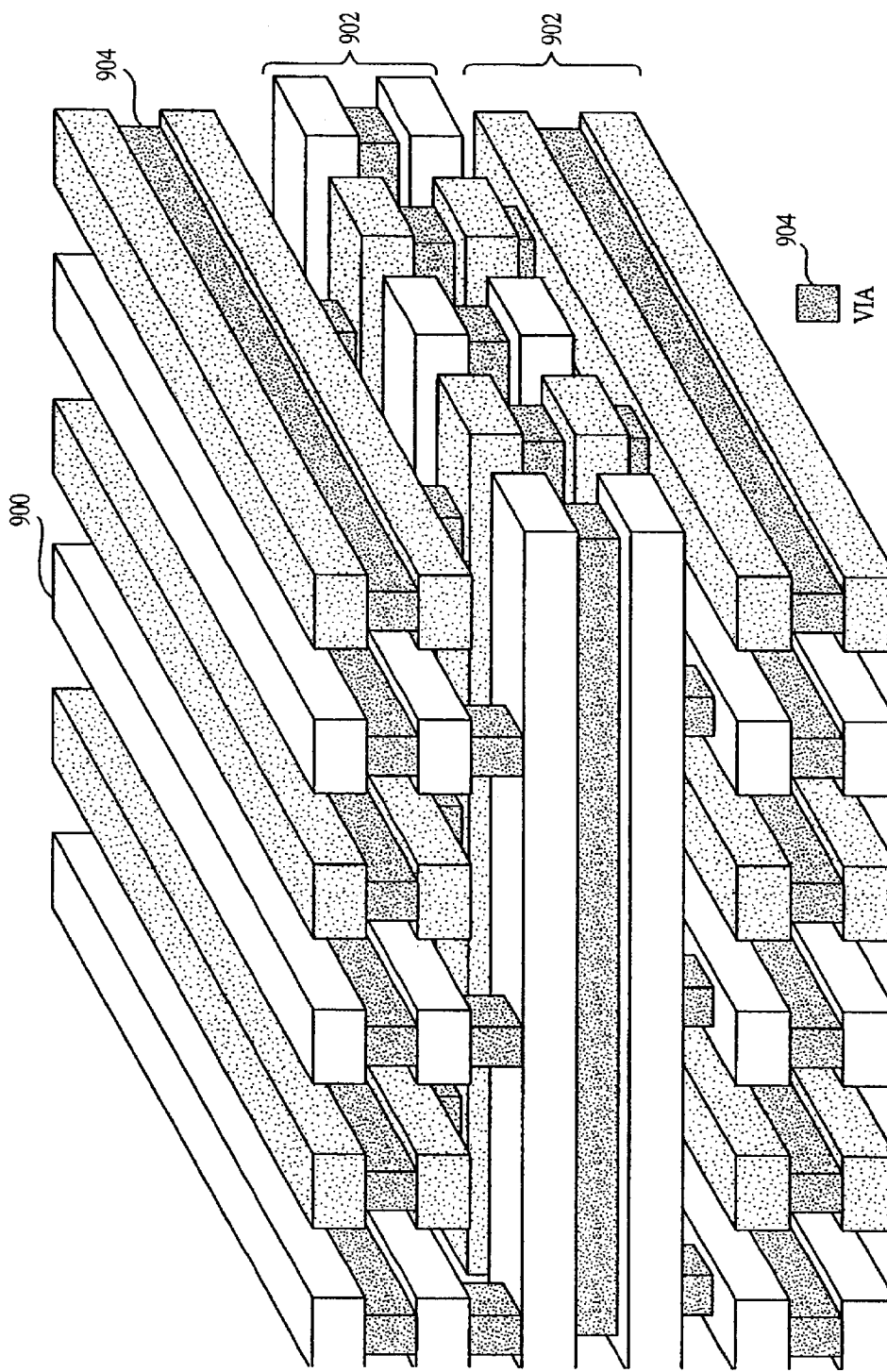
FIG. 9 represents an exemplary multi-layer VPP structure, in accordance with the present invention.

FIG. 9 illustrates a fifth structure, referred to herein as a multiple-layer vertical parallel plate VPP structure 900. The multiple-layer VPP structure 900 comprises multiple (more than two) VPP structures 902, wherein a previous VPP structure 902 is positioned in a first direction. A subsequent VPP structure 902 is located on top of the previous VPP structure 902, and the subsequent VPP structure 902 is positioned in a second direction. The second direction is orthogonal to the first direction. The VPP structures 902 are positioned on top of each other in the above-described manner, until all of the VPP structures 902 have been stacked. It is noted that each VPP structure 902 can have different types of vias 904 or each VPP structure 902 can have the same type of vias 904. In FIG. 9, each of the VPP structures 902 have slotted vias 904. Those skilled in the art will recognize that any combination of vias 904 can be used without departing from the scope of the present invention.

Figure 1:
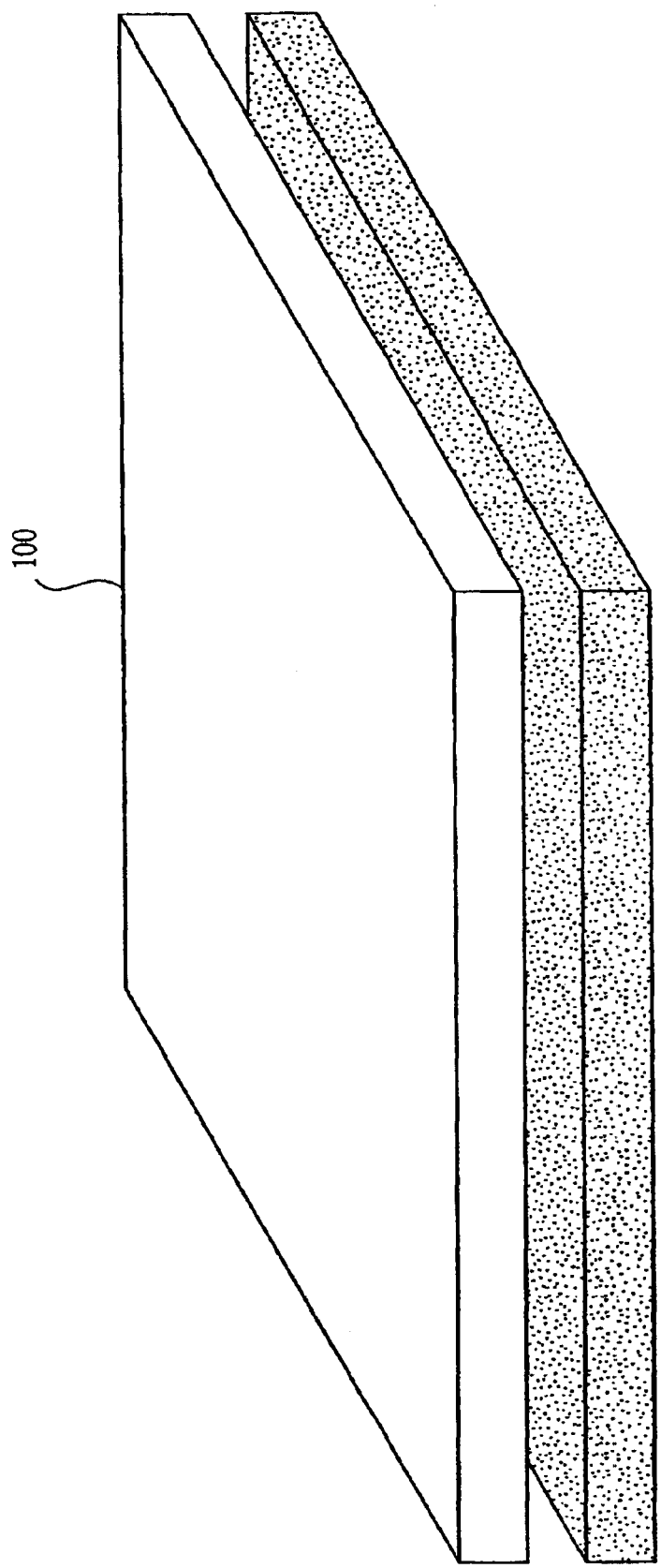
FIG. 1 represents a prior art parallel plate structure.

The capacitor value of the standard, horizontal parallel plate capacitor 100 of FIG. 1 is primarily determined by the oxide thickness. On the other hand, the exact capacitor values of the VPP 300 and VB 600 capacitor structures are determined by lithography and etching. These two processes are quite accurate in today's process technologies. It is therefore reasonable to suspect that the lateral component of these capacitors should be more repeatable and have smaller variation across a wafer. In this case, it is clear that any structure combining the lateral and vertical field component will suffer from the accuracy of the vertical capacitance component, which will lead to inferior matching and tolerance properties. Practically, all of the existing integrated capacitive structures use the vertical fields, and hence, cannot achieve the best possible accuracy. This hypothesis can be verified experimentally, as discussed later.

Figure 10:
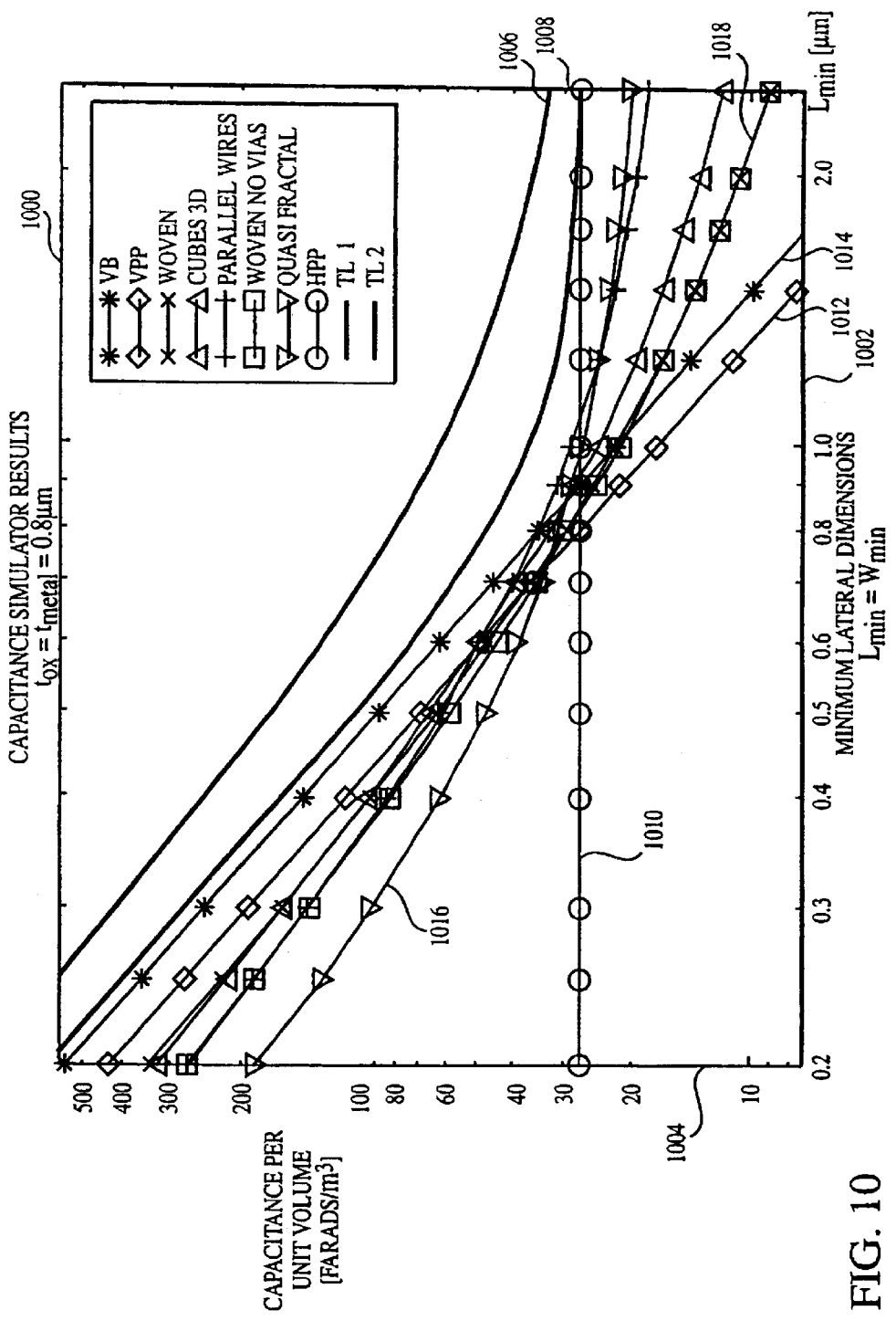
FIG. 10 shows a graph of simulated capacitance densities per unit volume as a function of minimum lateral spacing.

To gain more insight into the effectiveness of lateral and vertical field usage in metal-to-metal capacitor structures, the capacitance densities for each of the capacitor structures discussed above were simulated using a simulator developed for this purpose, and assuming a larger number of metal layers. FIG. 10 shows a graph 1000 of the simulation results. The horizontal axis 1002 represents the minimum lateral dimensions, and the vertical axis 1004 represents the capacitance per unit volume.

Figure 2:
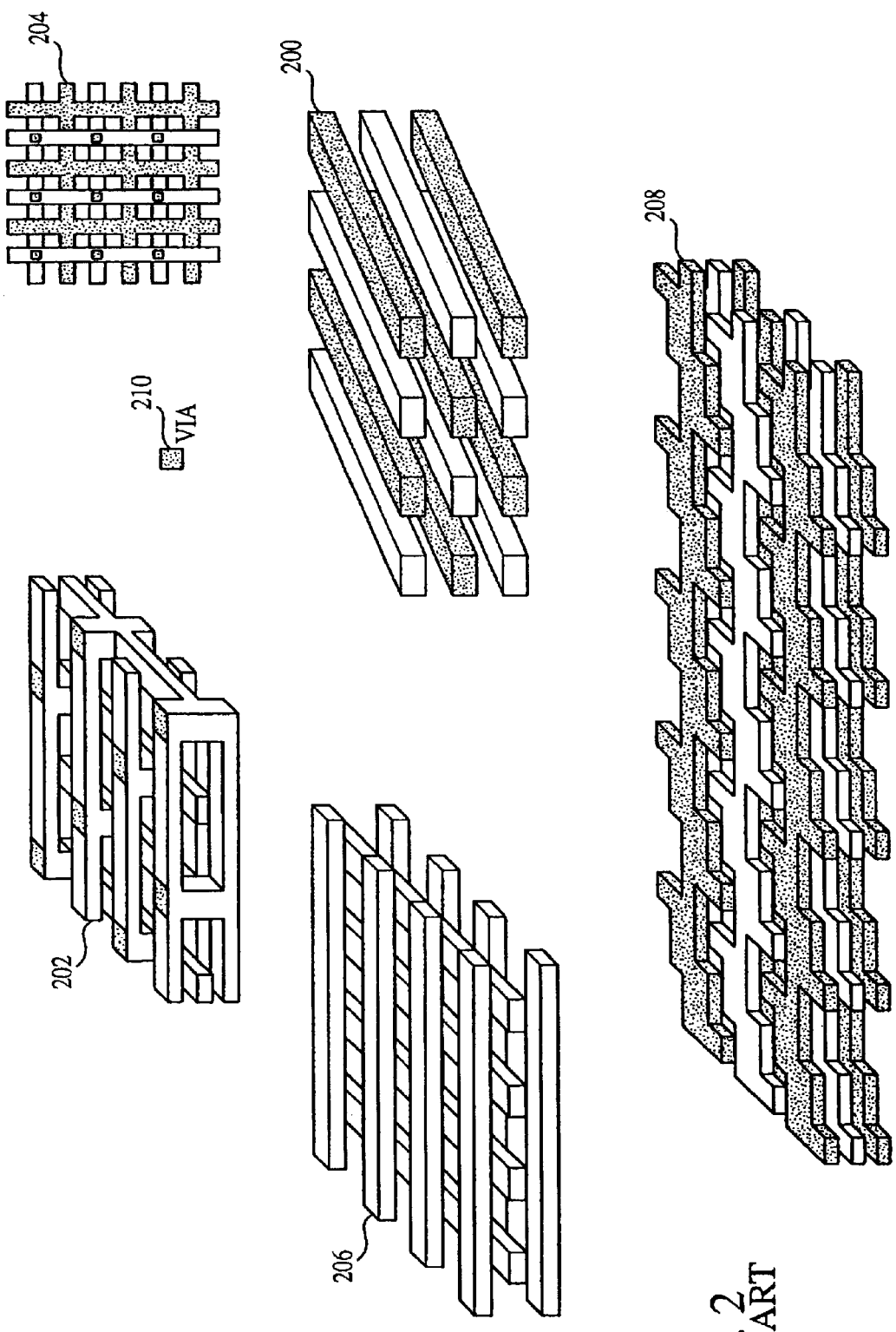
FIG. 2 represents prior art structures that exploit both lateral and vertical electrical fields.

The simulated structures include the following: the HPP structure 100 (shown in FIG. 1), the VPP structure 300 (shown in FIG. 3), the woven structure 202 and the woven structure without vias 206 (both shown in FIG. 2), parallel wires 200 (also referred to as interdigitated and HB, shown in FIG. 2), the quasi-fractal structure 208 (shown in FIG. 2), and the VB structure 600 (shown in FIG. 6), and the Cubes 3D structure (not shown).

A theoretical framework is necessary to understand the comparison of the various capacitor structures. The following paragraphs will reveal that the capacitance of any arbitrary capacitive structure can be decomposed into three components that are associated with three orthogonal spatial dimensions. This decomposition can be used to find the theoretical upper bounds for the total capacitance of rectangular (Manhattan) structures. This can be done by noting that the total electrostatic energy, $U_E$, in a capacitor, C, is given by:

$$U_E = \frac{C \cdot \Delta V^2}{2} \qquad (1)$$

where $\Delta V$ is the voltage drop across its two terminals. The capacitance of an arbitrary structure can be calculated by integrating the electrostatic energy density, u, over the entire dielectric volume to obtain the total stored electrostatic energy, $U_E$, for a given voltage drop, $\Delta V$, between the two terminals of the capacitor, i.e., $$C = \frac{2 \cdot U_E}{\Delta V^2} = \frac{2}{\Delta V^2} \int_{Vol} u(\vec{r}) dv \qquad (2)$$

where $\vec{r}$ is the position vector and dv is the differential unit of volume. For an isotropic dielectric material, the electrostatic energy density is given by:

$$u(\vec{r}) = \frac{\vec{E}(\vec{r}) \cdot \vec{D}(\vec{r})}{2} = \qquad (3)$$

$$\frac{\varepsilon_0 \varepsilon_r}{2} E^2(\vec{r}) = \frac{\varepsilon_0 \varepsilon_r}{2} [E_x^2(\vec{r}) + E_y^2(\vec{r}) + E_z^2(\vec{r})] = u_x(\vec{r}) + u_y(\vec{r}) + u_z(\vec{r})$$

where $\vec{E}$ and $\vec{D}$ are the electric and displacement vectors, $\varepsilon_0$ is the permittivity of free space, $\varepsilon_r$ is the relative permittivity of the dielectric, and $u_x$, $u_y$, and $u_z$ are the electrostatic energy densities due to the electric field components along the three Cartesian axes, namely, $E_x$, $E_y$, and $E_z$ respectively. Therefore, the density (capacitance per unit volume) can be calculated by integrating the sum of the three electrostatic field energy density components over the dielectric volume, i.e., $$c = \frac{C}{Vol} = \qquad (4)$$

$$\frac{1}{Vol} \cdot \frac{2}{\Delta V^2} \left[ \int_{Vol} u_x(\vec{r}) dv + \int_{Vol} u_y(\vec{r}) dv + \int_{Vol} u_z(\vec{r}) dv \right] = c_x + c_y + c_z$$

where c is the capacitance density of the structure (in Farad per cubic meter) and $c_x$, $c_y$, and $c_z$ are the capacitance densities due to the electric field components $E_x$, $E_y$, and $E_z$, respectively.

Figure 11:
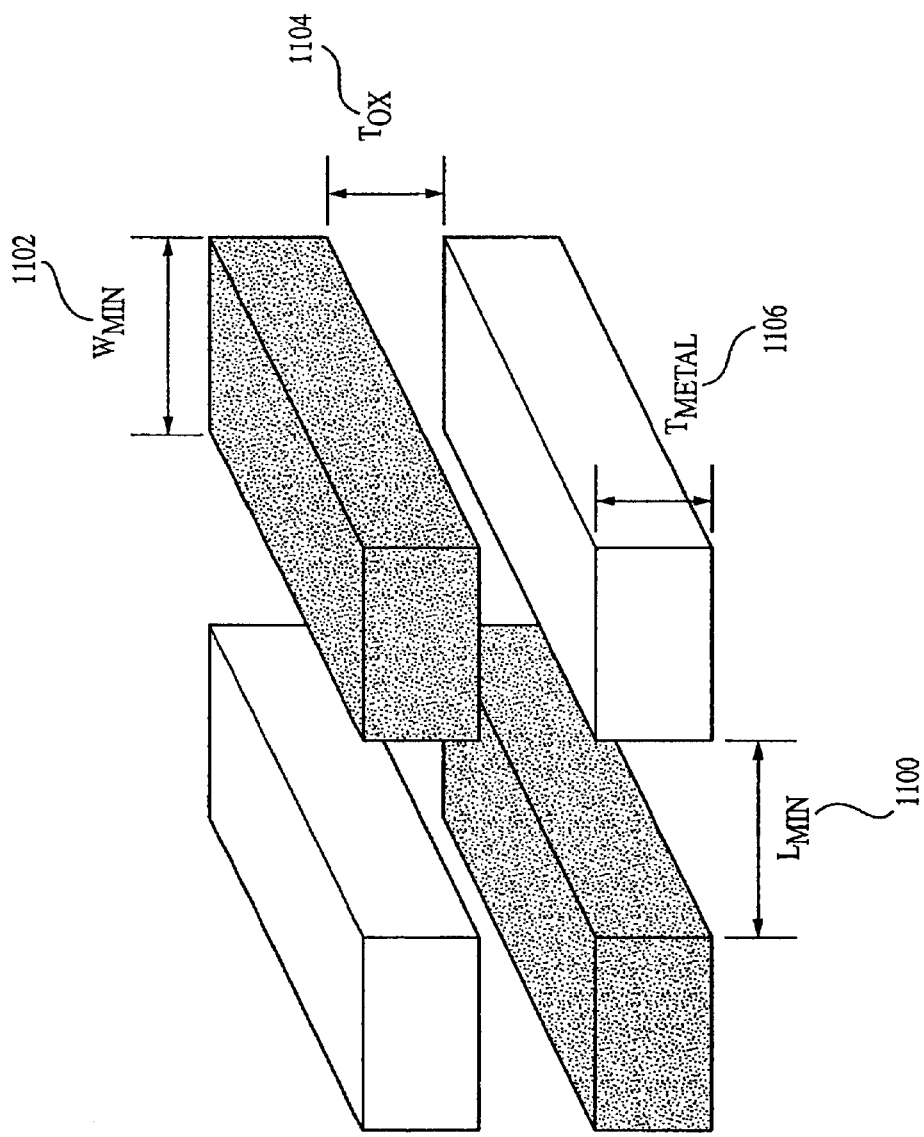
FIG. 11 represents the dimensions of the metal lines.
Figure 12:
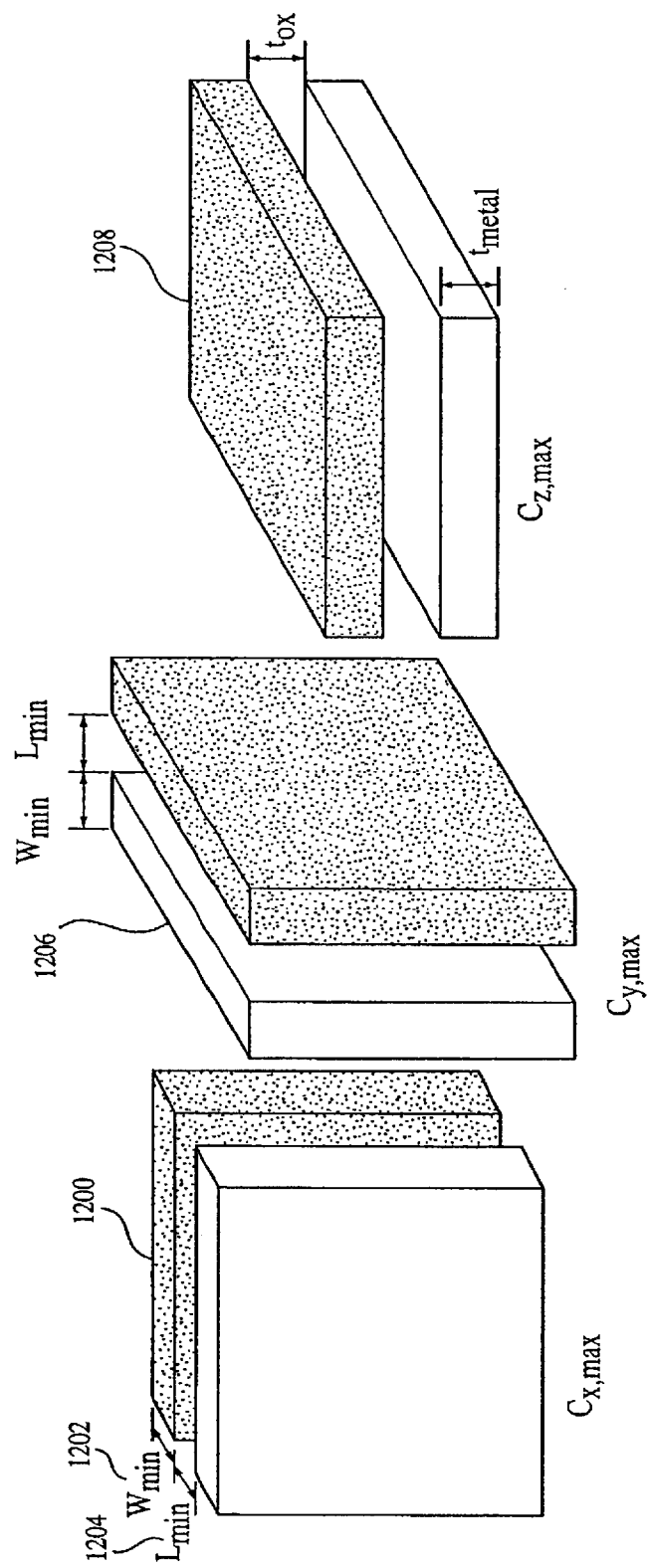
FIG. 12 shows parallel plate structures normal to the cartesian axis.

Now consider a process technology with a minimum lateral spacing of $L_{min}$ 1000, minimum metal width of $W_{min}$ 1102, a vertical spacing between two adjacent metal layers, $t_{ox}$ 1104 and a metal thickness, $t_{metal}$ 1106 as shown in FIG. 11. The total capacitance density, c, cannot exceed the sum of the maximums of its individual components, namely, $c_{x,max}$, $c_{y,max}$, and $c_{z,max}$. In other words, we have to maximize the capacitance density due to each component of the electric field separately, to obtain an upper bound on the density. FIG. 12 shows that the capacitance contribution of the electric field along the x axis, $c_x$, (with no constraint on the contributions of other field components) can be maximized by using a parallel plate structure 1200 with minimum plate thickness, $W_{min}$ 1202, and minimum spacing, $L_{min}$ 1204, perpendicular to the x axis. The capacitive components along the y, and z axes can be maximized in a similar fashion by using minimum spacing parallel plate structures normal to these axes (1206 and 1208). Therefore, an upper bound on the total capacitance density can be obtained by adding the individual maximums of the capacitance density components, i.e., $$c_{max} = \qquad (5)$$

$$c_{x,max} + c_{y,max} + c_{z,max} = \varepsilon_0 \varepsilon_r \left[ \frac{2}{L_{min}(L_{min} + W_{min})} + \frac{1}{t_{ox}(t_{ox} + t_{metal})} \right]$$

This is a capacitance per unit volume, and can be easily translated to capacitance per unit area for a known number of metal layers. This maximum in the capacitance density will be referred to as Theoretical Limit 1 (TL1). Equation (5) defines an upper bound for the capacitance density of any metallic structure and can serve as a reference for comparison of various capacitive structures.

Figure 13:
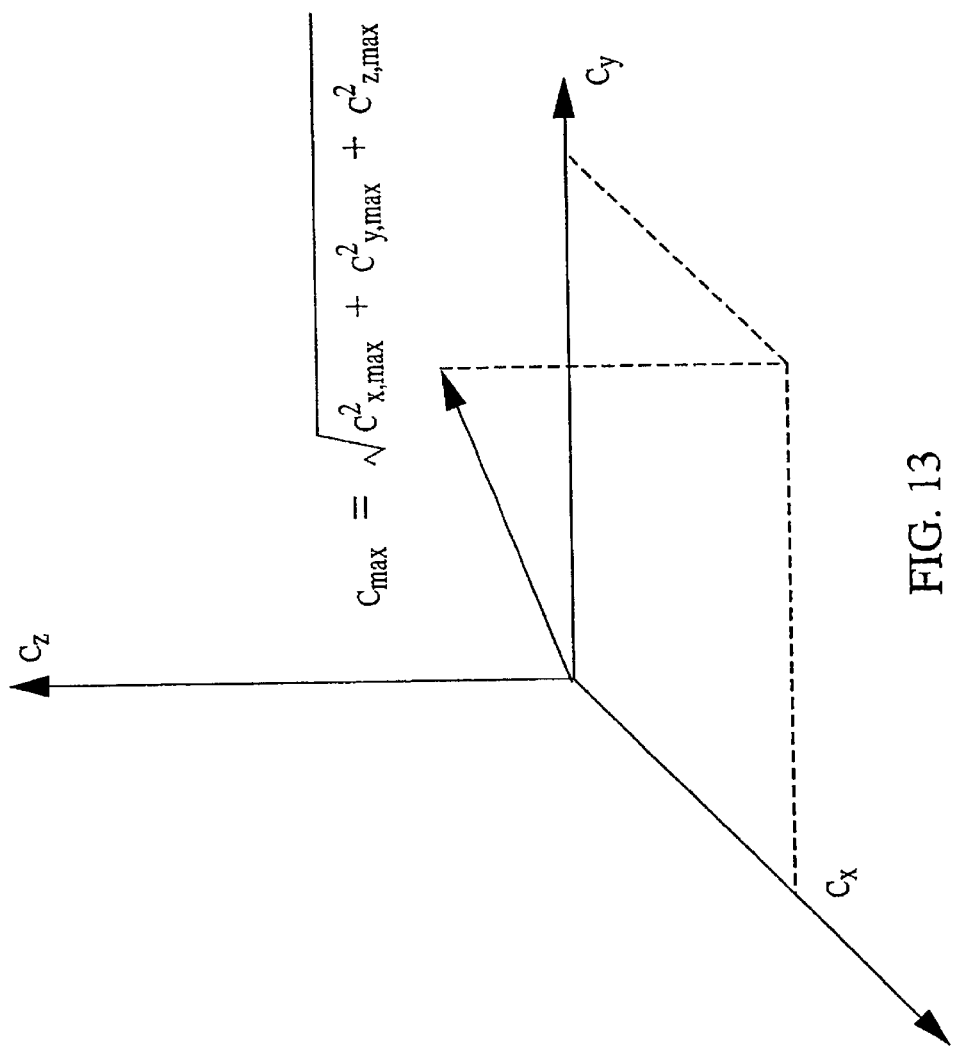
FIG. 13 represents the ortho-normal capacitance decomposition into lateral and vertical parallel plates.

Although the horizontal and vertical parallel plate capacitor structures of FIG. 12 have the maximum horizontal and vertical field usage, respectively, they cannot be implemented in the same spatial location simultaneously. This makes it impossible to achieve the maximum electric field usage in the x, y, and z dimensions at the same time, and therefore equation (5), while being correct, is too conservative. The orthogonality of the electric field components implies that the horizontal and vertical parallel plate capacitance densities, $c_x$, $c_y$, and $c_z$ may form an orthogonal basis for decomposition of capacitance densities as illustrated in FIG. 13. This orthogonal decomposition can be used to obtain a new tighter upper bound for the capacitance density of structures with rectangular (Manhattan) boundaries. FIG. 13 shows that the maximum capacitance is given by the magnitude of the vector sum of $c_{x,max}$, $c_{y,max}$, and $c_{z,max}$. The maximum capacitance density for any given process technology will be given by:

$$c_{max} = \sqrt{c_{x,max}^2 + c_{y,max}^2 + c_{z,max}^2} = \qquad (6)$$

$$\varepsilon_0 \varepsilon_r \sqrt{\frac{2}{L_{min}^2(L_{min} + W_{min})^2} + \frac{1}{t_{ox}^2(t_{ox} + t_{metal})^2}}$$

which will be referred to as Theoretical Limit 2 (TL2).

Returning to FIG. 10, the graph 1000 shows the simulated capacitance densities per unit volume as a function of the minimum lateral spacing, $L_{min}$. Equal lateral metal spacing 1100 and width 1102 (both shown in FIG. 11) was assumed, i.e., $L_{min}=W_{min}$. Both $t_{ox}$ 1104 and $t_{metal}$ 1106 (both shown in FIG. 11) are also kept constant at 8 $\mu$m. This is in accordance with the observation that lateral spacings keep scaling down as lithography advances, while the vertical dimensions do not scale at the same rate. Even though the graph 1000 is for particular values of $t_{ox}$ 1104 and $t_{metal}$ 1106, it can easily be used for other vertical spacings through a simple scaling, as long as, $t_{ox}=t_{metal}$ and $L_{min}=W_{min}$. TL1 1006 and TL2 1008 are also plotted in the graph 1000. As can be seen, none of the capacitance densities exceed either TL1 1006 or TL2 1008.

Two important regions can be identified in the simulation results of FIG. 10. For large lateral spacings, i.e., $L_{min} \gg t_{ox}$ (right hand side of the graph 1000), the capacitance density reaches plateaus as the lateral fields become inconsequential and the capacitance is dominated by the vertical fields. As can be seen, the HPP structure 1010 has the best performance in this region due to its optimal usage of vertical fields, and the VPP 1012 and VB 1014 continuously degrade due to the lack of any vertical field component. Other structures fall in between these two extremes and reach a capacity limit controlled by their vertical-to-lateral field usage efficiency.

At the other extreme, when the minimum lateral spacing is much smaller than the vertical separation, i.e. $L_{min} \ll t_{ox}$ (left hand side of the graph), the capacitance densities of the lateral field structures become inversely proportional to $L_{min}^2$ because the lateral plate spacing decreases linearly with lateral shrinkage, resulting in a linear increase in the capacitance per plate. In addition, the number of plates per unit volume grows linearly with decreasing $L_{min}$ due to the smaller metal width and spacing, resulting in an inverse $L_{min}^2$ dependence. It is therefore desirable to choose a capacitor with maximum lateral field usage, as the feature sizes shrink. Such a choice will result in a capacitor with minimum vertical field usage due to the inherent trade-off between lateral and vertical field utilization. In other words, the lateral field usage can only be increased by introducing dielectric regions between metal lines in the same layer, which in turn results in loss of the vertical component. As the HPP capacitor (shown in FIG. 1). It is noteworthy that the commonly used interdigitated (or HB) structure 200 (shown in FIG. 2) is inferior to the newly introduced VPP capacitor 300 (shown in FIG. 3), in capacitance density, quality factor, and self-resonance frequency.

Figure 14:
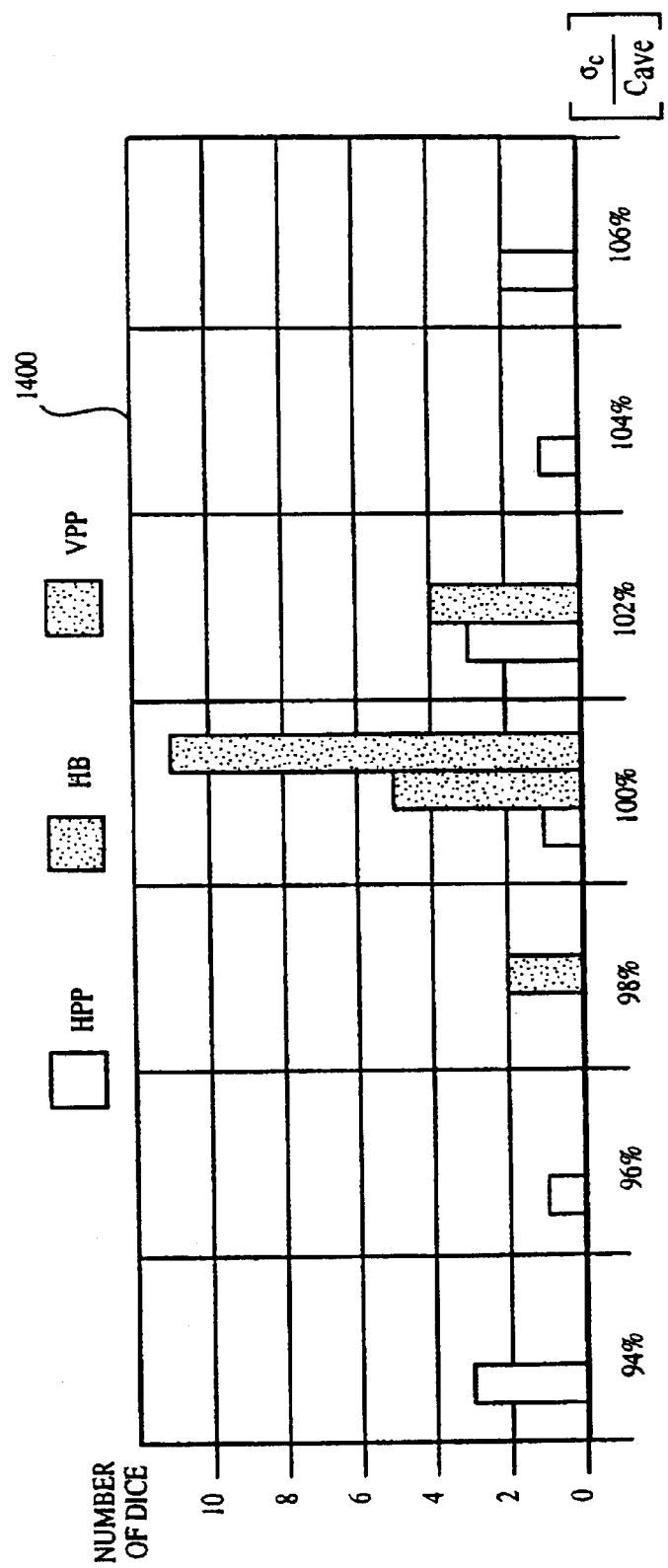
FIG. 14 shows the relative capacitance variations of the VPP, HB, and HPP structures.

To investigate the tolerance properties of the VPP capacitor 300 (shown in FIG. 3), the capacitance of these three structures were measured across twenty-two different sites, at different locations, on two quarters of two different 8-inch wafers. In FIG. 14, a histogram 1400 shows the relative capacitance value distribution across one of the quarter-wafers. The standard deviations of the capacitance, normalized to the average value for these three structures, are also shown in Table 1. It can be easily seen that the absolute capacitance accuracy of the VPP 300 capacitor is approximately an order of magnitude better than the conventional HPP 100. Comparison of the measurements on two different wafers also shows that wafer-to-wafer capacitance variation of the purely lateral structures is also improved significantly due to the higher repeatability of the lithography. Finally, due to the high breakdown voltage of the dielectric, the measured breakdown voltages of the implemented capacitors are in excess of 350V, as can be seen in the Table 1.

TABLE 1

Measurement Results (First Set)

| Structure | Cap. Density (c) [aF/$\mu$m$^2$] | Ave ($C_{ave}$) [pF] | Std. Dev. ($\sigma_c$) [fF] | $\frac{\sigma_c}{C_{ave}}$ | $f_{res}$ [GHz] | Q @ 1GHz | $f_{res}^{(fixed\ L)a}$ (C = 6.94 pF) [GHz] | $f_{res}^{(scaled\ L)b}$ (C = 6.94 pF) [GHz] | Rs ($\Omega$) | Break-Down [Volts] |
|---|---|---|---|---|---|---|---|---|---|---|
| VPP | 158.3 | 18.99 | 103 | 0.0054 | 3.65 | 14.5 | 6.04 | 9.99 | 0.57 | 355 |
| HB | 101.5 | 33.5 | 315 | 0.0094 | 1.1 | 8.6 | 2.42 | 5.31 | 0.55 | 380 |
| HPP | 35.8 | 6.94 | 427 | 0.0615 | 6.0 | 21 | 6.0 | 6.0 | 1.1 | 690 |

[a]Normalized self-resonance frequency calculated for a capacitance of 6.94 pF (the value of the HPP) assuming that only the capacitor changes and that the inductor does not scale.
[b]Normalized self-resonance frequency calculated for a capacitance of 6.94 pF (the value of the HPP) scaling both the capacitor and the inductor with size.

can be seen, the HPP structure 1010 has the worst performance in this region, and the VPP 1012 and VB 1014 attain the highest capacitance density.

In particular, for the case where $L_{min}=W_{min}=0.1$ $\mu$m and $t_{ox}=t_{metal}=1$ $\mu$m (or for any other case where the minimum lateral dimensions are ten times smaller than the vertical dimensions), VB 1014 and VPP 1012 achieve a remarkable capacitance density of 88% and 68% when compared to TL2 1008. In contrast, the woven 1018 and quasi-fractal structure 1016 show only an efficiency of 48% and 25% respectively. Therefore, TL2 1008 can be used as a means of efficiency comparison.

A two metal layer CMOS technology with an additional thick metal layer is used to fabricate the VPP 300, interdigitated or Horizontal Bars (HB) 200 and HPP 100 structures that occupy 0.12 mm$^2$, 0.33 mm$^2$, and 0.19 mm$^2$, respectively. The two lower metal layers have $L_{min}=W_{min}=0.5$ $\mu$m, $t_{ox}=0.95$ $\mu$m, and $t_{metal}=0.63$ $\mu$m. The performance numbers for these structures are summarized in Table 1. As can be seen, the VPP capacitor achieves a factor of 4.4 capacitance density improvement over the standard HPP using only two metal layers, but also for equal capacitance values demonstrate a higher self-resonance frequency than the HPP structure. This is based on the size-normalized self-resonance frequencies of the structures listed in Table 1. In terms of series resistance, the VPP capacitor has a series resistance, $r_S$, of 0.57 $\Omega$ comparable to an $r_S$ of 0.55 $\Omega$ for A second set of capacitors were fabricated in a purely digital CMOS 5-metal layer process technology with $L_{min}=W_{min}=0.24$ $\mu$m, $t_{ox}=0.7$ $\mu$m, and $t_{metal}=0.53$ $\mu$m. The implemented capacitors include a 5 metal layer HPP 100, a 5 metal layer VPP 300, and a 4 metal layer modified VB 700 structures. To perform a fair comparison, the value of the three different capacitor types are designed to be equal. A 1 pF and a 10 pF version of each structure were fabricated in the same die to provide an unbiased comparison of the structures' capacitance density, self-resonant frequency, tolerance and matching properties.

The summary of the measurements for the 1 pF capacitors are shown in Table 2. For the sake of comparison, the performance measures of a 1 pF Metal-Insulator-Metal (MIM) capacitor are also included in Table 2. Due to the lack of any MIM capacitor in the purely digital CMOS technology used, these performance measures are obtained from the design manual information for an MIM capacitor for a very similar process technology with $L_{min}=0.28$ $\mu$m and mixed signal capabilities.

Due to the high lateral field efficiency of the new proposed structures, the VPP 300 and VB 600 capacitors show 7.43 and 6.29 times more capacitance density than the standard multiplate HPP 100 of FIG. 1, respectively, which are the highest reported to date. This corresponds to a capacitance density of 1.51 fF/$\mu$m$^2$. As can be seen, the capacitance density of the VPP capacitor is even 37% higher than the capacitance density of the MIM capacitor.

TABLE 2

Measurement Results (Second Set - 1 pF capacitors)

| Structure | Cap. Density (c) [aF/$\mu$m$^2$] | Ave C$_{ave}$) [pF] | Area [$\mu$m$^2$] | Cap. Enhancement | Std. Dev. ($\sigma_c$) [fF] | $\frac{\sigma_c}{C_{ave}}$ | f$_{res}$ [GHz] | Measured Q @ 1 GHz | Break-Down [Volts] |
|---|---|---|---|---|---|---|---|---|---|
| VPP | 1512.2 | 1.01 | 669.9 | 7.4 | 5.06 | 0.0050 | >40 | 83.2 | 128 |
| VB | 1281.3 | 1.07 | 839.7 | 6.3 | 14.19 | 0.0132 | 37.1 | 48.7 | 124 |
| HPP | 203.6 | 1.09 | 5378.2 | 1.0 | 26.11 | 0.0238 | 21 | 63.8 | 500 |
| MIM | 1100 | 1.05 | 960.9 | 5.4 | | | 11 | 95 | |

Because of the multiple via connections and the large number of vertical plates connected in parallel, the VPP 300 structure presents a quality factor even higher than that of the HPP 100, whereas the quality factor of the VB 600 structure is degraded to some extent because of the relatively high via resistance of the process technology, as summarized in Table 2.

Figure 15:
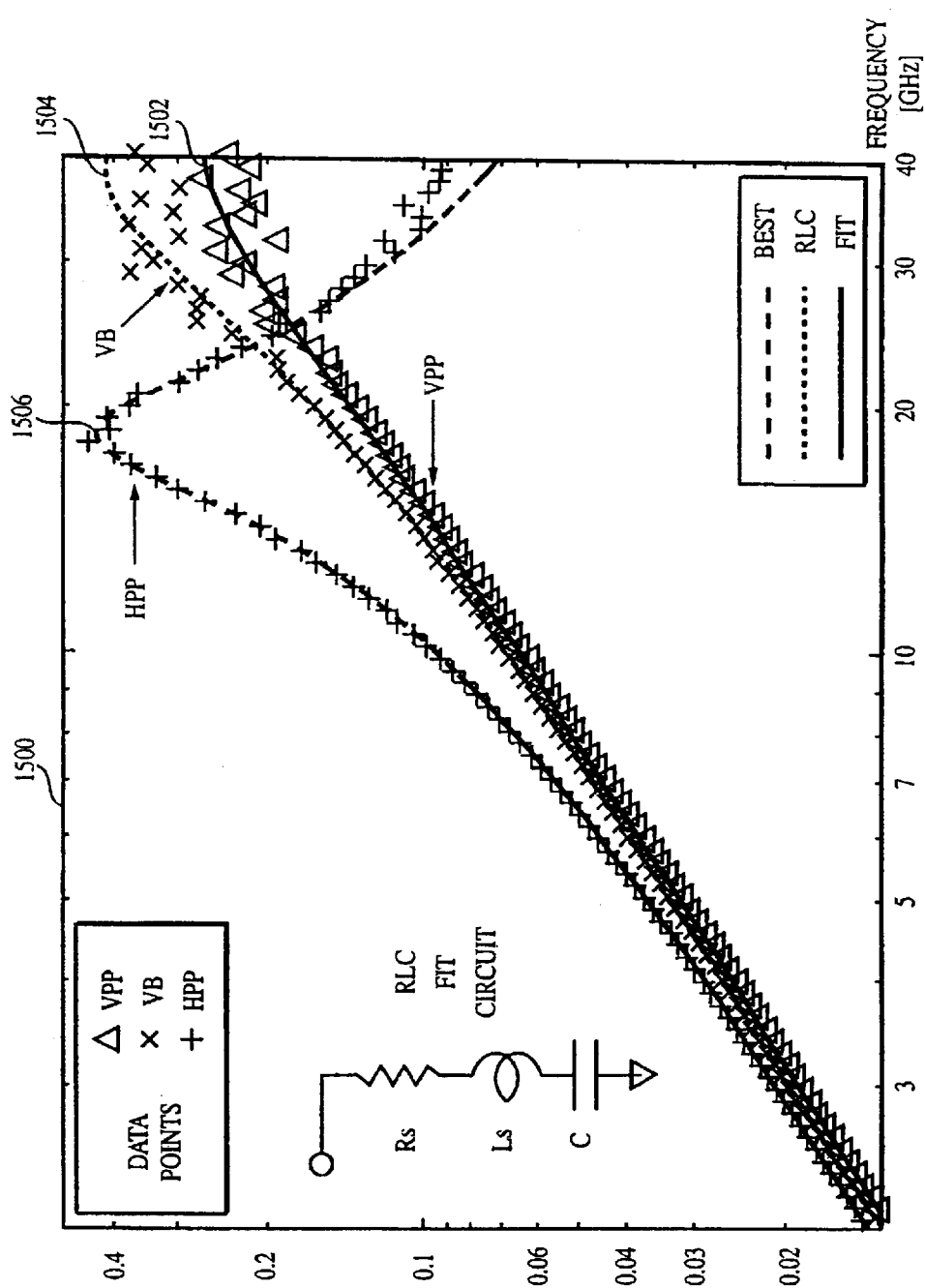
FIG. 15 shows a graph of the high-frequency one-port measurements of the VPP structure, the VB structure, and the HPP structure.

As the proposed structures attain higher capacitance densities, their physical dimensions are smaller and hence show higher self-resonance frequencies. The admittance vs frequency measurement 1500 of FIG. 15 shows a self-resonance frequency in excess of 40 GHz for the 1 pF VPP 1502 and VB 1504 capacitors. This is twice the self-resonance frequency of the HPP capacitor 1506, and 4 times higher than that of the MIM capacitor.

Finally, the summary of the measurements for the 10 pF capacitors are shown in Table 3. For the sake of comparison, Table 3 also includes the estimated performance measures of a 10 pF MIM capacitor. As can be seen, the VPP 300 and VB 600 capacitors show 8.0 and 6.6 times more capacitance density than the 10 pF standard multiplate HPP 100 of FIG. 1. This corresponds to a 34% higher capacitance density of the VPP 300 capacitor when compared to the MIM. The self-resonance frequencies of the proposed structures are in excess of 11 GHz, which is almost twice the self-resonance frequency of the HPP 100 capacitor, and approximately 3 times higher than that of the MIM. As can be seen, the 10 pF VPP 300 and VB 600 capacitors presents almost 3 times better capacitance tolerance than the HPP 100 structure across the wafer.

TABLE 3

Measurement Results (Second Set - 10 pF capacitors)

| Structure | Cap. Density (c) [aF/$\mu$m$^2$] | Ave C$_{ave}$) [pF] | Area [$\mu$m$^2$] | Cap. Enhancement | Std. Dev. ($\sigma_c$) [fF] | $\frac{\sigma_c}{C_{ave}}$ | f$_{res}$ [GHz] | Measured Q @ 1 GHz | Break-Down [Volts] |
|---|---|---|---|---|---|---|---|---|---|
| VPP | 1480.0 | 11.46 | 7749 | 8.0 | 73.43 | 0.0064 | 11.3 | 26.6 | 125 |
| VB | 1223.2 | 10.60 | 8665 | 6.6 | 73.21 | 0.0069 | 11.1 | 17.8 | 121 |
| HPP | 183.6 | 10.21 | 55615 | 1.0 | 182.14 | 0.0178 | 6.17 | 23.5 | 495 |
| MIM | 1100 | 10.13 | 9216 | 6.0 | | | 4.05 | 25.6 | |

Figure 16:
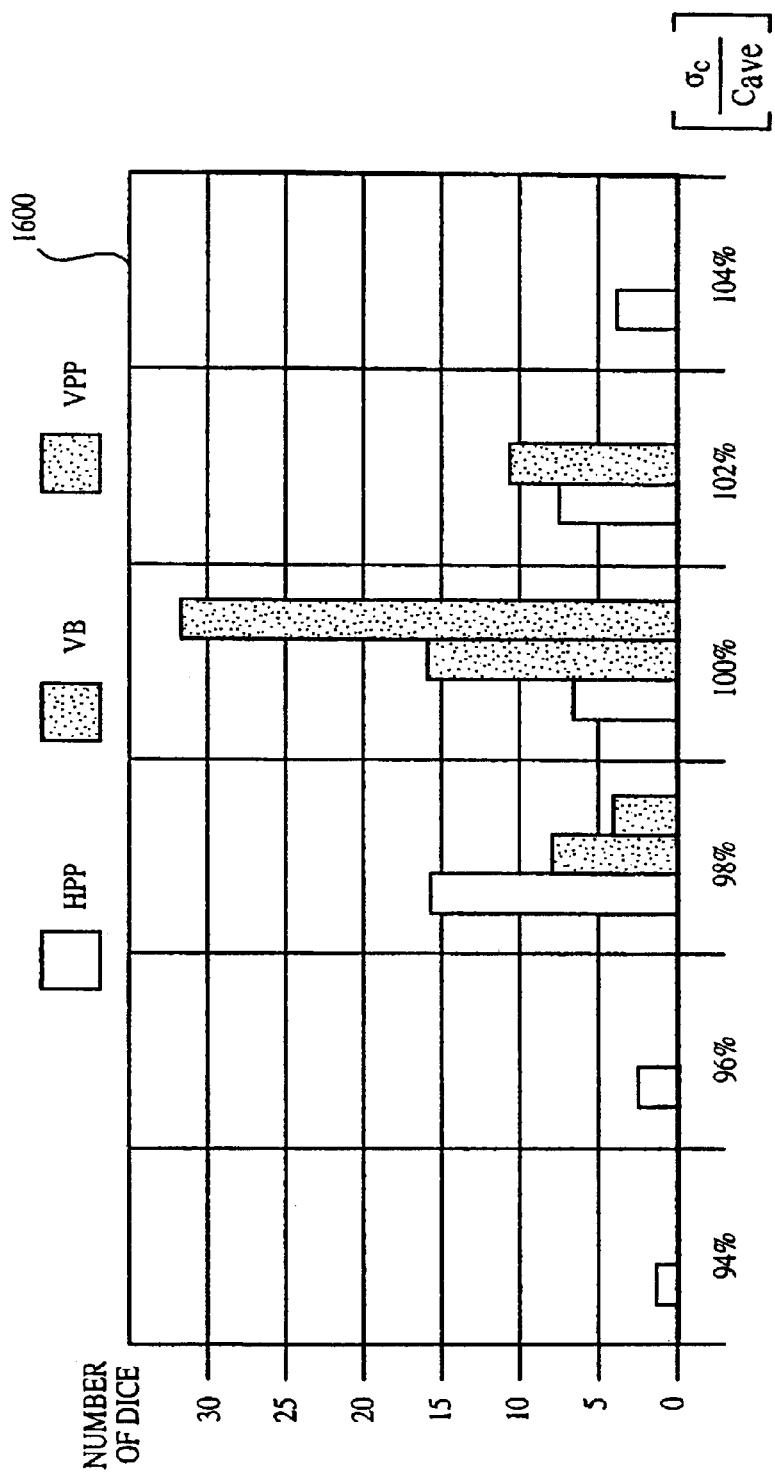
FIG. 16 shows the relative capacitance variations of the VPP, VB and HPP structures.

To verify the earlier hypothesis of better tolerance and matching properties of the purely lateral structures, the capacitance of capacitors of same values implemented using different structures were measured across 37 usable sites of an 8-inch wafer. The standard deviation normalized to the average value of each 1 pF structure is shown in Table 2. The histogram 1600 of FIG. 16 shows the variation of the three different capacitor structures across the wafer. As can be seen, the VPP 300 structure presents almost five times better capacitance tolerance than the HPP 100 structure across the wafer.

Although the tolerance of capacitors is an important property to quantify, in many analog applications, the parameter of more significance is the ratio between two adjacent capacitors. To confirm the better matching properties of the new structures, the ratio of adjacent 10 pF and 1 pF capacitors of the same type, on the same site, were compared across the wafer. The variations of this ratio normalized to its average is shown as $\sigma_r/r_{ave}$. The VPP 300, VB 600, and HPP 100 capacitors show a $\sigma_r/r_{ave}$ of 0.6%, 1%, and 1.3%, respectively. Due to the higher accuracy of the lithography process, the two new lateral field structures present better matching properties than the standard horizontal parallel plate capacitor or HPP 100, as suggested earlier. It is noteworthy that in practice, an accurately defined ratio is achieved by using multiple parallel capacitors of the same size and shape.

A new theoretical framework which shows the capacity limits of different capacitor structures was presented. This new framework can be used to evaluate the performance of the existing capacitive structures and leads to two purely lateral capacitor structures, namely VPP 300 and VB 600. These structures demonstrate: higher capacitance density, better tolerance and matching properties, and higher self-resonance frequency than previously reported capacitor structures, MIM and standard HPP capacitors, while maintaining a comparable quality factor. These two new structures are standard CMOS compatible and do not need an extra processing step, as is the case with special MIM capacitors.

Although the invention has been described in detail with reference only to the presently preferred embodiments, those of ordinary skill in the art will appreciate that various modifications can be made without departing from the invention. Accordingly, the invention is defined only by the following claims.

What is claimed:

1. A capacitor structure, comprising:
   in a first direction, a first layer comprising,
      a plurality of first layer vertical plates, wherein the first layer vertical plates are substantially parallel to each other, and wherein each first layer vertical plate comprises multiple first layer conducting strips;

the first layer conducting strips are substantially parallel to each other and are connected to each other by one or more first layer vias;

the first layer vertical plates are alternately connected to each other, creating a first portion of the first layer vertical plates and a second portion of the first layer vertical plates, such that the first portion of the first layer vertical plates forms a section of the first terminal of the capacitor structure and the second portion of the first layer vertical plates forms a section of the second terminal of the capacitor structure;

in a second direction, wherein the second direction is orthogonal to the first direction, a second layer comprising, a plurality of second layer vertical plates, wherein the second layer vertical plates are substantially parallel to each other, and wherein each second layer vertical plate comprises multiple second layer conducting strips;

the second layer conducting strips are substantially parallel to each other and are connected to each other by one or more second layer vias;

the second layer vertical plates are alternately connected to each other, creating a first portion of the second layer vertical plates and a second portion of the second layer vertical plates, such that the first portion of the second layer vertical plates forms a remaining section of the first terminal of the capacitor structure, and the second portion of the second layer vertical plates forms a remaining section of the second terminal of the capacitor structure; and whereby, the second layer is overlying the first layer in a top view.

2. The capacitor structure of claim 1, wherein slotted vias are used to connect conducting strips.

3. The capacitor structure of claim 1, wherein individual vias are used to connect conducting strips.

4. The capacitor structure of claim 1, wherein the conducting strips are metal conducting strips.

5. The capacitor structure of claim 1, wherein the conducting strips are poly-crystalline silicon strips.

6. The capacitor structure of claim 1, wherein each first layer vertical plate is located a predefined lateral distance from an adjacent first layer vertical plate, and wherein each second layer vertical plate is located a predefined lateral distance from an adjacent second layer vertical plate.

7. A capacitor structure, comprising:

more than two layers of vertical plates, wherein each layer is positioned in the following manner, in a first direction, a previous layer comprising, a plurality of previous layer vertical plates, wherein the previous layer vertical plates are substantially parallel to each other, and wherein each previous layer vertical plate comprises multiple previous layer conducting strips;

the previous layer conducting strips are substantially parallel to each other and are connected to each other by one or more previous layer vias;

the previous layer vertical plates are alternately connected to each other, creating a first portion of the previous layer vertical plates and a second portion of the previous layer vertical plates, such that the first portion of the previous layer vertical plates forms a section of the first terminal of the capacitor structure and the second portion of the previous layer vertical plates forms a section of the second terminal of the capacitor structure;

in a second direction, wherein the second direction is orthogonal to the first direction, a subsequent layer comprising, a plurality of subsequent layer vertical plates, wherein the subsequent layer vertical plates are substantially parallel to each other, and wherein each subsequent layer vertical plate comprises multiple subsequent layer conducting strips;

the subsequent layer conducting strips are substantially parallel to each other and are connected to each other by one or more subsequent layer vias;

the subsequent layer vertical plates are alternately connected to each other, creating a first portion of the subsequent layer vertical plates and a second portion of the subsequent layer vertical plates, such that the first portion of the subsequent layer vertical plates forms a remaining section of the first terminal of the capacitor structure, and the second portion of the subsequent layer vertical plates forms a remaining section of the second terminal of the capacitor structure; and whereby, the subsequent layer is overlying the previous layer in a top view.

8. The capacitor structure of claim 7, wherein slotted vias are used to connect conducting strips.

9. The capacitor structure of claim 7, wherein individual vias are used to connect conducting strips.

10. The capacitor structure of claim 7, wherein the conducting strips are metal conducting strips.

11. The capacitor structure of claim 7, wherein the conducting strips are poly-crystalline silicon strips.

12. The capacitor structure of claim 7, wherein each first layer vertical plate is located a predefined lateral distance from an adjacent first layer vertical plate, and wherein each second layer vertical plate is located a predefined lateral distance from an adjacent second layer vertical plate.

* * * * *